United States Patent
Chern et al.

(10) Patent No.: US 6,429,135 B1
(45) Date of Patent: Aug. 6, 2002

(54) METHOD OF REDUCING STRESS BETWEEN A NITRIDE SILICON SPACER AND A SUBSTRATE

(75) Inventors: Horng-Nan Chern, Tainan Hsien; Kun-Chi Lin, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/754,354

(22) Filed: Jan. 5, 2001

(51) Int. Cl.⁷ ............................................. H01L 21/302
(52) U.S. Cl. ..................... 438/692; 438/694; 438/697; 438/723; 438/724
(58) Field of Search ................................ 438/692, 694, 438/697, 700, 702, 723, 724, 743, 744

(56) References Cited

U.S. PATENT DOCUMENTS 5,789,304 A * 8/1998 Fisher et al. ................ 438/396
6,060,351 A * 5/2000 Parekh et al. ............... 438/253
6,090,677 A * 7/2000 Burke et al. ................ 438/308
6,207,485 B1 * 3/2001 Gardner et al. ............. 438/216

* cited by examiner

Primary Examiner—Benjamin L. Utech
Assistant Examiner—Binh X Tran
(74) Attorney, Agent, or Firm—Winston Hsu

(57) ABSTRACT

The semiconductor wafer includes a substrate, a gate positioned on the substrate, a cap layer positioned on top of the gate, and a silicon oxide spacer positioned around both the gate and the cap layer. Firstly, a dielectric layer is formed on the semiconductor wafer to cover the gate. An etching back process is then performed to remove portions of both the dielectric layer and the silicon oxide spacer. Finally, a silicon nitride spacer is formed on the dielectric layer around the cap layer. The silicon nitride spacer is positioned on the surface of the dielectric layer and functions in reducing stress between the silicon nitride spacer and the substrate.

10 Claims, 4 Drawing Sheets

METHOD OF REDUCING STRESS BETWEEN A NITRIDE SILICON SPACER AND A SUBSTRATE

BACKGROUND OF THE INVENTION

1. Field of the Invention

The present invention relates to a method of forming a spacer, and more particularly, to a method of forming a silicon nitride spacer for reducing the stress between the silicon nitride spacer and a substrate.

2. Description of the Prior Art

In semiconductor devices, a metal oxide semiconductor (MOS) transistor is composed of a gate, a drain, and a source. Both the structure and the quality of the gate in the MOS transistor decide the electrical performance of the MOS transistor. In present semiconductor processes, two spacers of dielectric material are typically formed on either side of the gate in order to protect the gate from damage and ensure the electrical performance of the gate. In addition, the spacers can be used as a hard mask in the subsequent ion implantation process for the formation of the source and drain of the MOS transistor.

Please refer to FIG. 1 to FIG. 4. FIG. 1 to FIG. 4 are schematic diagrams of a prior art method of forming a spacer 28 around a gate 22. The spacer 28 around the gate 22 is positioned on a semiconductor wafer 10. As shown in FIG. 1, the semiconductor wafer 10 includes a substrate 12, and a dielectric layer 14 positioned on the substrate 12 functioning as a gate oxide. Each gate 22 includes a conductive layer 16 positioned on the dielectric layer 14, and a silicide layer 18 positioned on the conductive layer 16 to reduce the resistance of the conductive layer 16. A cap layer 20 is positioned on top of the gate 22 to protect the gate 22. The dielectric layer 14 is formed of silicon dioxide, and the conductive layer 16 is formed of doped polysilicon. Tungsten silicide is a typical material used in the formation of the silicide layer 18, and silicon nitride is commonly used to form the cap layer 20.

As shown in FIG. 2, an ion implantation process is performed to form doped regions 30 adjacent to the gates 22 in the silicon substrate 12. The doped regions 30 are used as lightly doped drains of the MOS transistor. A low-pressure chemical vapor deposition (LPCVD) is then performed to form a silicon nitride layer 26 to uniformly cover both the gate 22 and the silicon substrate 12.

As shown in FIG. 3, an anisotropic dry etching process is performed to remove portions of the silicon nitride layer 26 positioned on both the gate 22 and the silicon substrate 12. Portions of the silicon nitride layer 26 remaining around the walls of the gate 22 thereby form the spacers 28. As shown in FIG. 4, using the spacers 28 as hard masks, another ion implantation process is performed to form doped regions 32 beneath each of the doped regions 30 in the substrate 12. The fabrication of the MOS transistor is thus complete, whereby the doped regions 32 are used as the source and the drain of the MOS transistor.

Silicon nitride, a material having a high dielectric constant, is used to form the spacers 28 in the prior art method. However, the tension stress of silicon nitride is greater than $10^{10}$ dyne/cm$^2$ so that high stress occurs between the spacer 28 and the substrate 12, and between the spacer 28 and the gate 22. The resulting high stress may cause the spacer 28 to strip away from the substrate 12 due to poor adhesion between the spacer 28 and the substrate 12. Consequently, less protection and a greater amount of leakage occur in the gate 22 to affect product reliability.

In addition, in the prior art method of forming a word line structure in the dynamic random access memory (DRAM) process, silicon nitride is used to form the cap layer 20, located on top of the gate 22, and the spacers 28, that is, the gate 22 is surrounded by silicon nitride. Since the dielectric constant of silicon nitride materials is greater than that of silicon oxide materials, a larger couple capacitance occurs between the word line and a bit line, and between the word line and a storage node.

SUMMARY OF THE INVENTION

It is therefore a primary objective of the present invention to provide a method of reducing stress between the silicon nitride spacer and the substrate on a semiconductor wafer so as to solve the problems of the prior art.

In a preferred embodiment of the present invention, the semiconductor wafer includes a substrate, a gate positioned on the substrate, a cap layer positioned on top of the gate, and a silicon oxide spacer positioned around both the gate and the cap layer. A dielectric layer is first formed on the semiconductor wafer covering the gate. An etching back process is then performed to remove portions of both the dielectric layer and the silicon oxide spacer. Finally, a silicon nitride spacer is formed on the dielectric layer around the cap layer. The silicon nitride spacer is positioned on the surface of the dielectric layer to reduce the stress between the silicon nitride spacer and the substrate.

It is an advantage that the present invention uses silicon oxide to replace portions of the silicon nitride spacer around the gate, so that stress is reduced between the silicon nitride spacer and the silicon substrate, to further reduce leakage in the MOS transistor. As well, the couple capacitance between the word line and the bit line, and between the word line and the storage node is also reduced.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
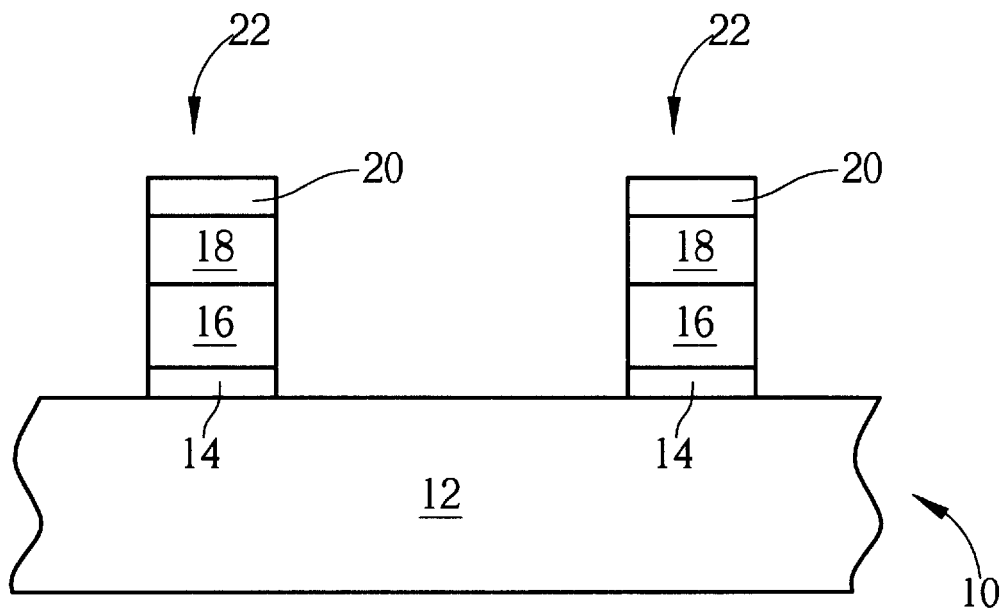
FIG. 1 to FIG. 4 are schematic diagrams of a method of forming a spacer around a gate according to the prior art.
Figure 2:
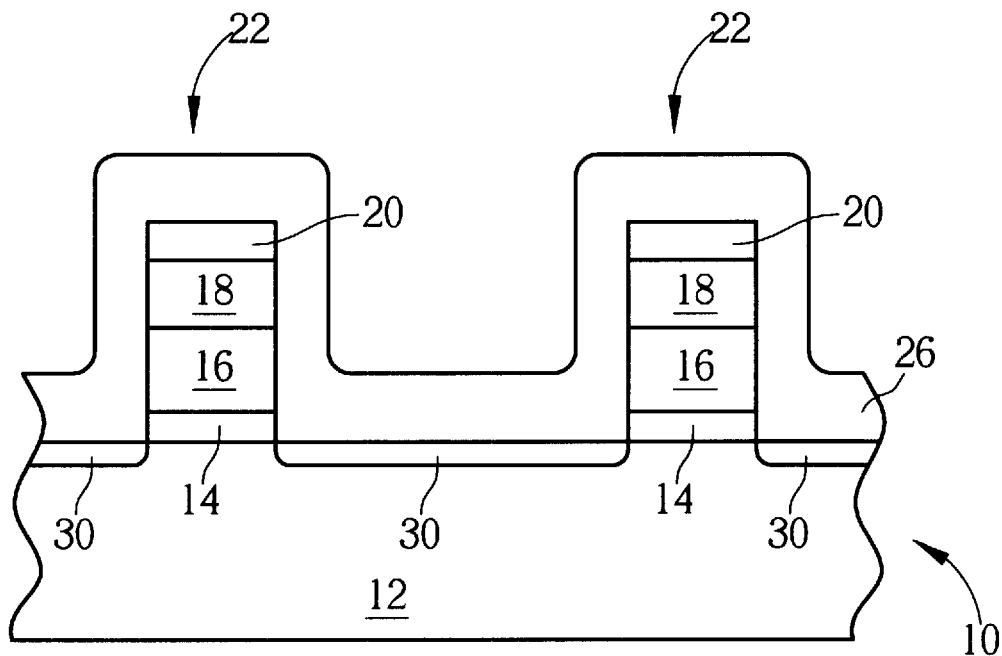
Figure 3:
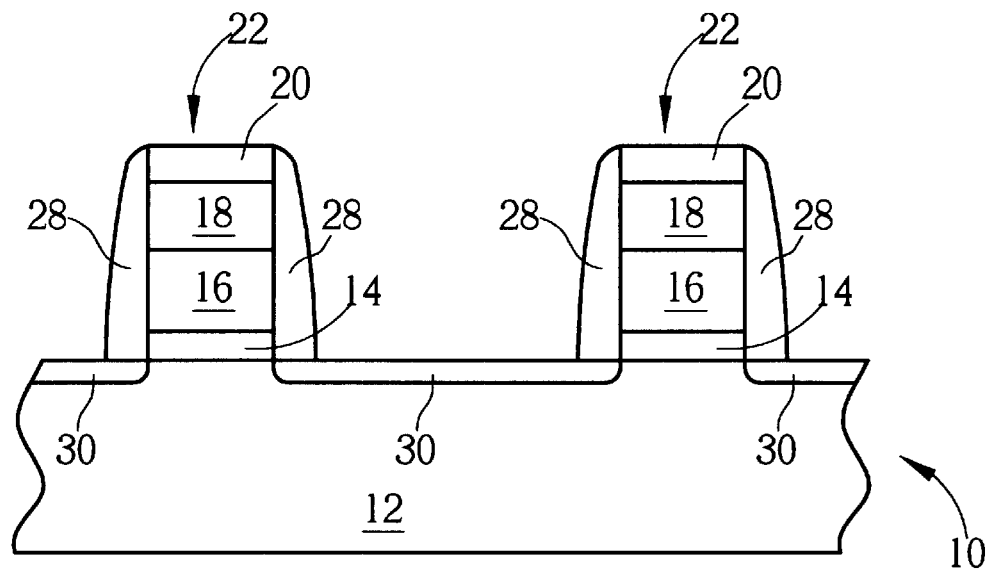
Figure 4:
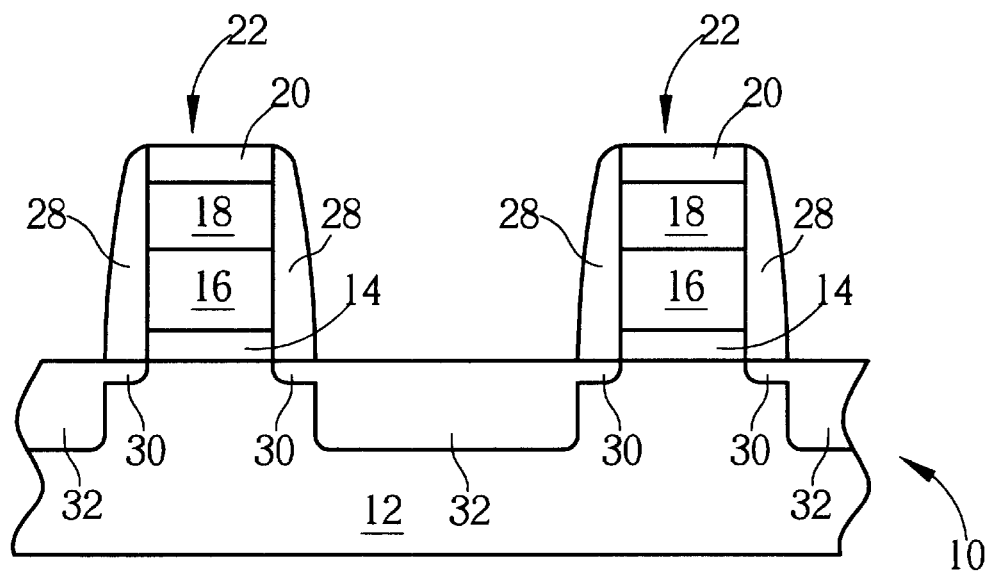
Figure 5:
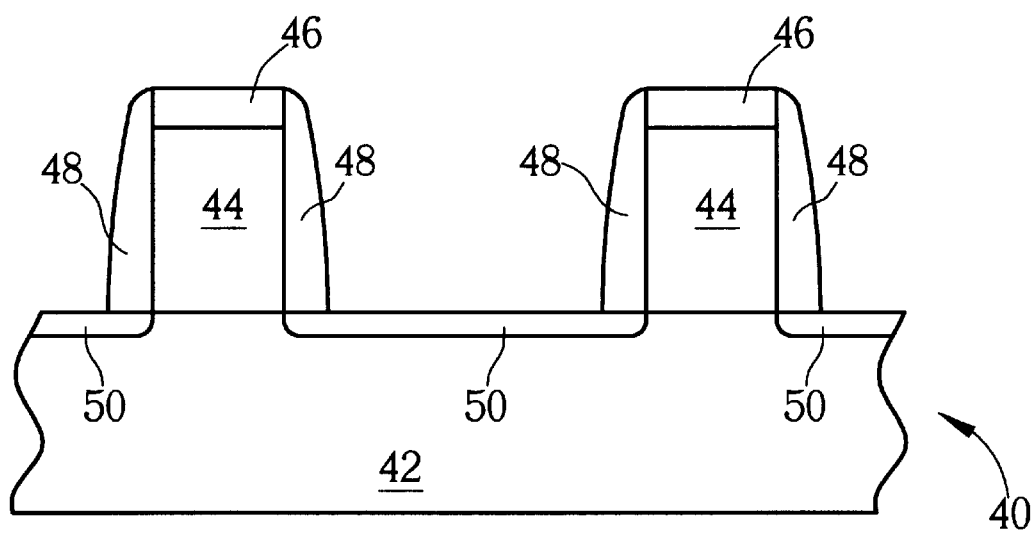
FIG. 5 to FIG. 8 are schematic diagrams of a method of forming a spacer around a gate according to the present invention.
Figure 6:
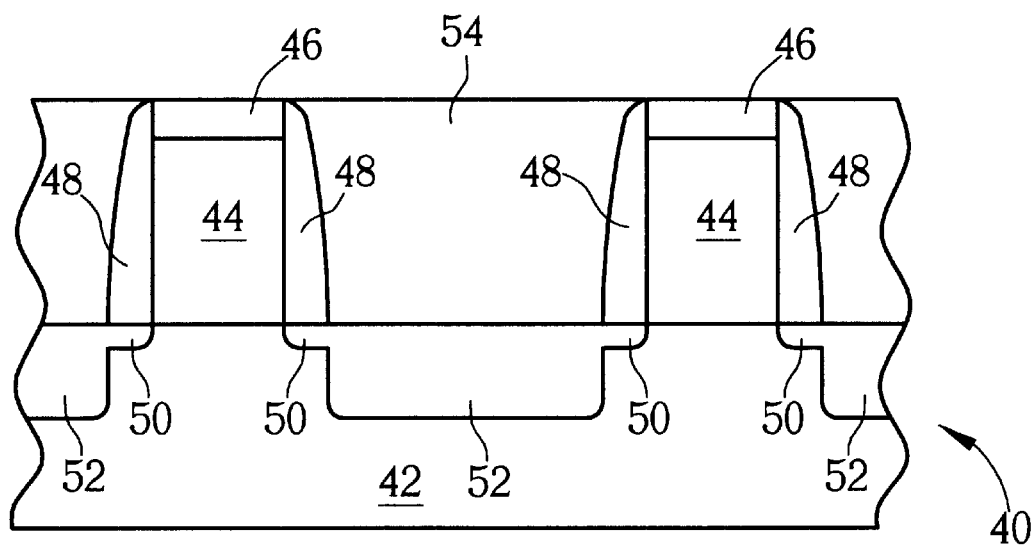

Please refer to FIG. 5 to FIG. 8. FIG. 5 to FIG. 8 are schematic diagrams of a method of forming a spacer 48 around a gate 44 according to the present invention. The spacer 48 around the gate 44 is positioned on a semiconductor wafer 40. As shown in FIG. 5, the semiconductor wafer 40 includes a silicon substrate 42, and a gate 44 positioned on the surface of the substrate 42. The semiconductor wafer 40 further includes two lightly doped drains 50 adjacent to the gate 44 in the substrate 42, and a cap layer 46 formed of silicon nitride positioned on top of the gate 44. In the present invention, a silicon oxide spacer 48 is first formed on either side of both the gate 44 and the cap layer 46. As shown in FIG. 6, using the silicon oxide spacer 48 as a hard mask, an ion implantation process is performed to form the source/drain 52 of the MOS transistor in the substrate 42. A dielectric layer 54 is then formed on the semiconductor wafer 40 to cover the gate 44 and the cap layer 46. Both the dielectric layer 54 and the silicon oxide spacer 48 are made of silicon dioxide, and thus combine to form a dielectric layer 58.

Figure 7:
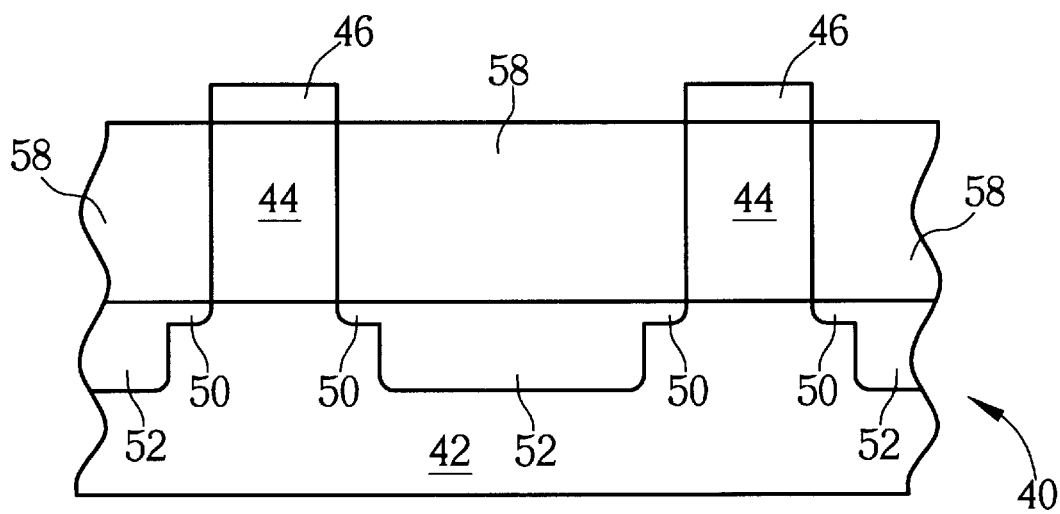
Figure 8:
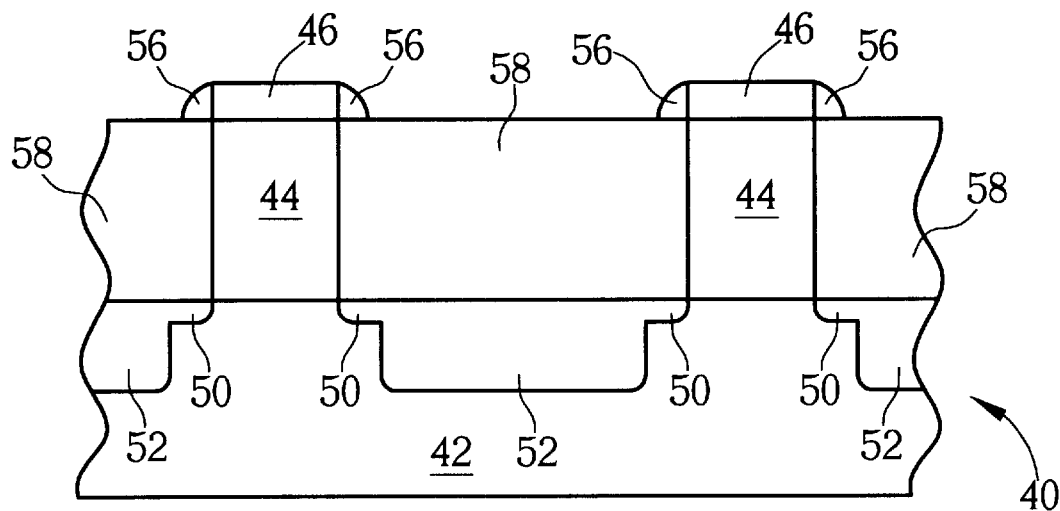

As shown in FIG. 7, a chemical mechanical polishing (CMP) process is performed to planarize the surface of the dielectric layer 58. An etching back process is then performed to remove portions of the dielectric layer 58 to align the surface of the dielectric layer 58 with the interface of the gate 44 and the cap layer 46. As shown in FIG. 8, a silicon nitride layer (not shown) is formed on the semiconductor wafer 40, and an anisotropic dry etching process is performed to form a silicon nitride spacer 56 around either side of the cap layer 46 on the surface of the dielectric layer 58.

In the present invention method of forming the silicon nitride spacer 56, a silicon oxide spacer 48 is first formed around the gate 44 and the cap layer 46, followed by the formation of a dielectric layer 54 which combines with the silicon oxide spacer 48 to form a dielectric layer 58. An etching process is performed to etch the dielectric layer 58 to the interface of the cap layer 46 and the gate 44. Finally, a silicon nitride spacer 56 is formed around the cap layer 46. Since the adhesion properties between silicon nitride and silicon oxide is better than that between silicon nitride and silicon, the silicon nitride spacer 56 of the present invention is formed on the surface of the dielectric layer 58 rather than on the silicon substrate 42. Consequently, the silicon nitride spacer 56 is prevented from directly contacting the silicon substrate 42 causing high stress. As well, a portion of the gate 44 in the present invention is surrounded by the silicon nitride spacer 56, with the other portion of the gate 44 surrounded by the dielectric layer 58 of silicon dioxide. Thus, the couple capacitance between the word line and the bit line, and between the word line and the storage node is reduced.

In comparison to the prior art method of forming a spacer, the present invention uses silicon oxide to replace portions of the silicon nitride spacer around the gate, and forms a silicon nitride spacer around the cap layer. Thus, the method of the present invention reduces the stress between the silicon nitride spacer and the silicon substrate, as well as further reducing leakage in the MOS transistor. As well, use of silicon oxide, which has a lower dielectric constant than silicon nitride, reduces the couple capacitance between the word line and the bit line, and between the word line and the storage node.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of reducing stress between a nitride silicon spacer and a substrate on a semiconductor wafer, the semiconductor wafer comprising the substrate, a gate positioned on the substrate, a cap layer positioned on top of the gate, and a silicon oxide spacer positioned around the gate and the cap layer, the method comprising:

forming a dielectric layer on the semiconductor wafer, wherein the dielectric layer covers the gate, and the dielectric layer is made of the same material as the silicon oxide spacer;

performing a chemical mechanical polishing (CMP) process to align a top surface of the dielectric layer with a top surface of the cap layer;

performing an etching back process to remove portions of the dielectric layer and portions of the silicon oxide spacer; and forming the silicon nitride spacer around the cap layer, wherein the silicon nitride spacer is positioned on the surface of the dielectric layer to reduce stress between the nitride silicon spacer and the substrate.

2. The method of claim 1 wherein the silicon oxide spacer and the dielectric layer are both made of silicon dioxide.

3. The method of claim 1 wherein the method further comprises an ion implantation process performed prior to the formation of the dielectric layer, the ion implantation process uses the silicon oxide spacer as a mask to form a source or a drain.

4. The method of claim 1 wherein the cap layer is made of silicon nitride.

5. A method of forming a bit line or a word line on a semiconductor wafer, the semiconductor wafer comprising a substrate, a gate positioned on the substrate, and a cap layer positioned on top of the gate, the method comprising:

forming a dielectric layer on the semiconductor wafer, wherein the dielectric layer covers the gate;

performing a chemical mechanical polishing (CMP) process to align a top surface of the dielectric layer with a top surface of the cap layer;

performing an etching back process to remove portions of the dielectric layer to align the surface of the dielectric layer with the interface of the gate and the cap layer; and forming a spacer around the cap layer to finish the formation of the bit line or the word line.

6. The method of claim 5 wherein the cap layer is made of silicon nitride.

7. The method of claim 5 wherein the spacer is made of silicon nitride.

8. The method of claim 5 wherein a silicon oxide spacer is positioned around the gate and the cap layer.

9. The method of claim 8 wherein the silicon oxide spacer and the dielectric layer are both made of silicon dioxide.

10. The method of claim 8 wherein the method further comprises an ion implantation process performed prior to the formation of the dielectric layer, the ion implantation process uses the silicon oxide spacer as a mask to form a source or a drain.

* * * * *